United States Patent [19]
>
> Ledenbach et al.

[11] 4,178,549

[45] Dec. 11, 1979

[54] RECOGNITION OF A RECEIVED SIGNAL AS BEING FROM A PARTICULAR TRANSMITTER

[75] Inventors: Gregory W. Ledenbach, San Jose; Dennis E. Morris, Saratoga, both of Calif.

[73] Assignee: National Semiconductor Corporation, Santa Clara, Calif.

[21] Appl. No.: 890,464

[22] Filed: Mar. 27, 1978

[51] Int. Cl.² ............................................. H04B 1/06
[52] U.S. Cl. .................................. 325/38 R; 325/302; 325/325
[58] Field of Search ................... 325/37, 55, 64, 38 R, 325/302, 325; 340/147 R, 164 R, 167 R, 168 R

[56] References Cited

U.S. PATENT DOCUMENTS

| Re. 29,525 | 1/1978 | Willmott | 325/37 |
|---|---|---|---|
| 3,906,348 | 9/1975 | Willmott | 325/37 |
| 4,037,201 | 7/1977 | Willmott | 340/167 R |
| 4,047,107 | 9/1977 | Dickinson | 325/37 |
| 4,072,898 | 2/1978 | Hellman | 325/37 |
| 4,087,793 | 5/1978 | Lucas | 340/164 R |
| 4,095,211 | 6/1978 | Shaughnessy | 340/164 R |
| 4,114,142 | 9/1978 | Wycoff | 340/164 R |

*Primary Examiner*—Benedict V. Safourek
*Assistant Examiner*—Michael A. Masinick
*Attorney, Agent, or Firm*—Brown & Martin

[57] ABSTRACT

A system for recognizing a received encoded signal as being from a particular transmitter is disclosed. An encoder encodes a signal to have a predetermined sequence of pulses of three different predetermined sequence of pulses of three different predetermined durations within a constant bit interval in accordance with a trinary code; wherein each of the different predetermined durations corresponds to a different bit. A decoder is coupled to the receiver for recognizing the received encoded signal as being from the particular transmitter includes a programmable digital logic signal generator that is programmed in accordance with the trinary code for generating a programmed digital logic signal having a predetermined sequence of different digital words corresponding to the predetermined sequence of pulses of different predetermined durations in the transmitted encoded signal; a code converter for converting the received encoded signal to a decoded digital logic signal having digital words in accordance with the selected code by measuring and comparing the relative durations of the pulse and the non-pulse time during each bit interval; a comparator for comparing the decoded digital logic signal with the programmed digital logic signal; and a control logic circuit coupled to the programmable signal generator, the code converter and the comparator for synchronizing the programmed digital logic signal with the decoded digital logic signal and for recognizing the received encoded signal as being from the transmitter when said comparison indicates a predetermined number and sequence of valid comparisons between the decoded digital logic signal and the programmed digital logic signal.

18 Claims, 5 Drawing Figures

RECOGNITION OF A RECEIVED SIGNAL AS BEING FROM A PARTICULAR TRANSMITTER

BACKGROUND OF THE INVENTION

The present invention generally pertains to digital signal processing and is particularly directed to a system for recognizing a received encoded digital signal as being from a particular transmitter.

The recognition of a received encoded signal as being from a particular transmitter is important in systems wherein an apparatus at one location is remotely controlled from another location. In a garage door actuation system, for example, an encoded signal transmitted from an automobile actuates a garage door opener only if it is recognized upon receipt as being from a particular transmitter.

One technique of encoding the transmitted signal so as to define a discrete communications channel between only a selected receiver and a particular transmitter has been to allocate a different carrier frequency to each such channel. However, the number of available discrete carrier frequencies is limited and systems using carrier frequency allocation often have been actuated inadvertently or accidently by stray signals having the same carrier frequency.

In an improved transmitter and receiver encoding system described in U.S. Pat. No. 3,906,348 to Willmott, a plurality of two-position switches establish a binary serially transmitted code at the transmitter that will energize only the particular receiver which is set to the same binary code by an equivalent number of two-position switches at the receiver. Although there are a limited number of carrier frequencies that can be used in transmitters and receivers of this type, the total number of available combinations is many times that available wherein only different carrier frequencies are used to isolate the different transmitter and receiver combinations. Willmott's system also provides that in the unlikely event that a similar transmitter and receiver are located within radio frequency range in which the same radio frequency channel and the particular binary coding has been selected, that the binary coding can be changed in the transmitter-receiver to a different coding by merely resetting the two-position switches and thus eliminating any possible interference.

In Willmott's system a digital logic signal derived from the received encoded signal is compared with a programmed digital logic signal that is encoded by the settings of the two-position switches at the receiver; and the received signal is recognized as being from the particular transmitter upon the receipt of four successive "valid" encoded signals.

SUMMARY OF THE INVENTION

The present invention provides an improved decoder and system for recognizing a received encoded signal as being from a particular transmitter. Referring to FIG. 1, the system includes an encoder 10, a transmitter 12, a receiver 14 and a decoder 16.

The encoder 10 encodes a digital signal to have a predetermined sequence of pulses of different predetermined durations within a constant bit interval in accordance with a selected code; wherein each of the different predetermined durations corresponds to a different bit. The transmitter 12 transmits the encoded signal; and the receiver 14 receives the transmitted encoded signal. The decoder 16 recognizes the received encoded signal as being from the transmitter 12.

The decoder 16 includes a programmable digital logic signal generator 18, a code converter 20, a comparator 22, and a control logic circuit 24. The programmable digital logic signal generator 18 is programmed in accordance with the selected code for generating a programmed digital logic signal on lines 19 having a predetermined sequence of different digital words corresponding to the predetermined sequence of pulses of different predetermined durations in the transmitted encoded signal. The code converter 20 converts the encoded signal received on line 15 to a decoded digital logic signal on line 21 in accordance with the selected code. The comparator 22 compares the decoded digital logic signal on line 21 with the programmed digital logic signal on lines 19. The control logic circuit 24 is coupled to the programmable signal generator 18, the code converter 20 and the comparator 22 for synchronizing the programmed digital logic signal on lines 19 with the decoded digital logic signal on line 21 and for recognizing the received encoded signal on line 15 as being from the transmitter 12 when the comparison by the comparator 22 indicates a predetermined number and sequence of valid comparisons between the decoded digital logic signal on line 21 and the programmed digital logic signal on lines 19. When the control logic circuit recognizes the received encoded signal on line 15 as being from the transmitter 12 a control output 25 is enabled.

In accordance with the present invention, the code converter measures and compares the relative durations of the pulse and non-pulse time during each interval and provides a decoded digital logic signal having digital words corresponding to one or another of the predetermined durations in accordance with the comparison of the relative durations. Preferably, the code converter includes a level detector 26 for detecting whether the received encoded signal on line 15 has a high level or a low level; an up/down counter 28 for counting at a much higher rate than the pulse rate of the received encoded signal on line 15, and connected to the level detector 26 for counting up when the received encoded signal on line 15 is high and for counting down when the received encoded signal on line 15 is low; and a decode logic circuit 30 coupled to the receiver 14 and the counter 28 for providing a decoded digital logic signal on line 21 having digital words corresponding to one or another of the predetermined durations in accordance with the accumulated count in the counter 28 upon a predetermined transition in the level of the received encoded signal on line 15.

The relationship of the accumulated count to the different predetermined durations is explained with reference to FIG. 2. In the preferred embodiment the transmitted encoded signal is a pulse width modulated signal that is encoded in accordance with a trinary code, wherein each bit has one of three different predetermined durations T1, T2 and T3. The duration T1 is approximately 25% of the total bit time; the duration T2, 50%, and the duration T3, 75%. Assuming that each bit time is nominally 100 counts of the counter 28, and the counter 28 is initially set at zero, a pulse of duration T1 would cause the counter 28 to have an accumulated count of −50, whereas a pulse duration T2 would cause the counter 28 to have an accumulated count of approximately "0"; and a pulse duration T3 would cause the counter to have accumulated a count of +50. The decode logic circuit 30 defines three predetermined ranges of counts, each of which broadly encompasses one of the three ideally accumulated counts of −50, 0, and +50; and provides a decoded logic signal on line 21 having a word corresponding to one or another of these three broad ranges of counts.

One feature of the present invention is the utilization of a trinary code in the decoder and system of the present invention. The primary advantage of a trinary code is that a greater number of discrete codes can be selected than with a binary code for the same number of bit times in the encoded signal thereby reducing system costs. For example, with ten inputs in a binary encoded system there are $2^{10}$ or 1024 available codes. In a trinary encoded system there are $3^{10}$ or 59,049 available codes. This is a factor of better than 57.

Although it might be expected that a system utilizing a trinary code would necessarily require expensive components to distinguish between the three different predetermined pulse durations in the receivee encoded signal, especially in view of frequency and phase shifts that are commonly experienced in signal transmission; the code converter of the present invention including the up/down counter enables the trinary encoded system of the present invention to be constructed with relatively inexpensive hardware. This is because the code converter provides a decoded digital logic signal in accordance with within which one of three relatively broad ranges the compared measurements of the relative durations of the pulse and the non-pulse time falls. Thus the required accuracy between the tuned oscillation frequency of the transmitter and the receiver can be greatly reduced over that in conventional PWM transmission systems, thereby enabling less expensive circuit components to be used. Using the code converter of the present invention these oscillators do not require trimming, thereby reducing system costs, and increasing reliability. Also, the decoder clocking signals are provided by an oscillator in which the timing element is a simple inexpensive untuned RC circuit having a tolerance of ±10%.

Additional features of the present invention are described in the description of the preferred embodiment.

DESCRIPTION OF THE PREFERRED EMBODIMENT

Figure 1:
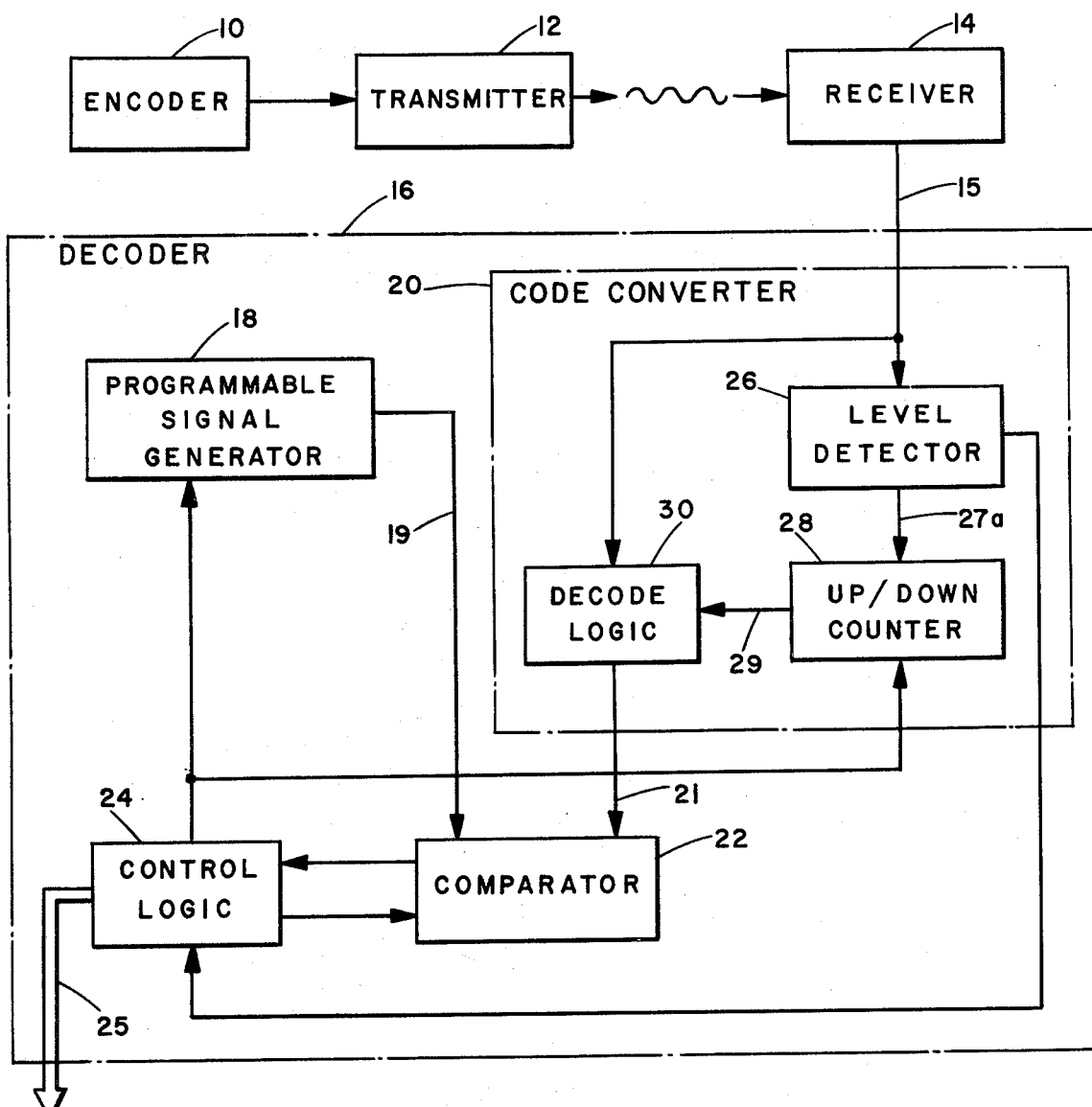
FIG. 1 is a block diagram of the system of the present invention.
Figure 2:
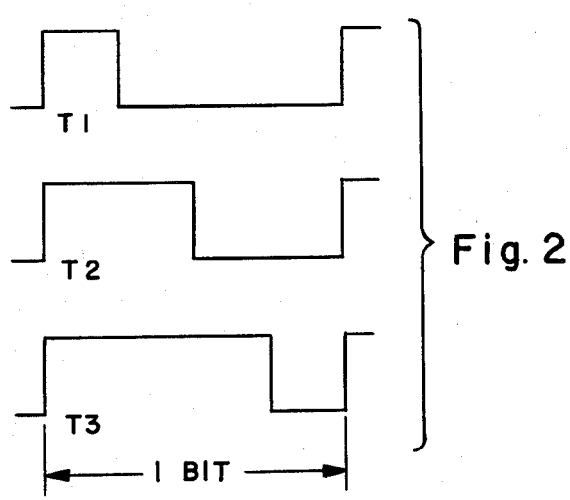
FIG. 2 shows different predetermined pulse durations in a trinary encoded signal utilized in the preferred embodiment of the system of the present invention.
Figure 3:
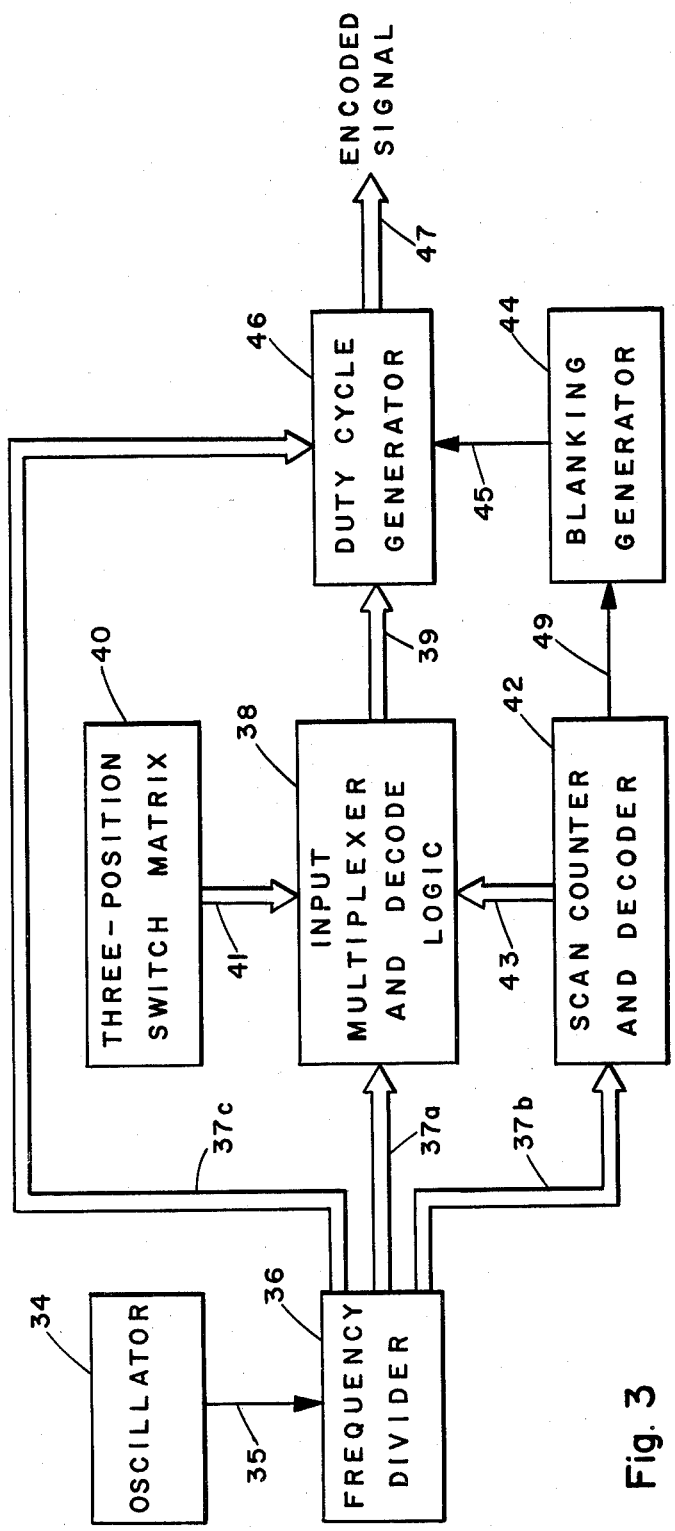
FIG. 3 is a schematic block diagram of a preferred embodiment of the encoder included in the system of the present invention.

The preferred embodiment of the present invention is encoded in accordance with a trinary code. Referring to FIG. 3, the encoder 10 includes an oscillator 34, a frequency divider 36, an input multiplexer and decode logic circuit 38, a matrix of three-position switches 40, a scan counter and decoder 42, a blanking generator 44, and a duty cycle generator 46.

The oscillator 34 is an R/C oscillator. The RC circuit of the oscillator 34 determines the frequency of a pulsed master clock signal, which is provided on line 35. Except for the RC circuit, the oscillator 34 is contained within an integrated circuit. The RC circuit is external to the integrated circuit and the components thereof can readily be selected so as to select the frequency of the master clock signal on line 35.

The frequency divider 36 divides the pulsed master clock signal on line 35 to provide a plurality of different pulsed clock signals on lines 37a, 37b and 37c. The pulsed clocked signals on lines 37a, 37b and 37c control the timing of the operations of the input multiplexer and decode logic circuit 38, the scan counter and decoder 42 and the duty cycle generator 46 respectively.

The input multiplexer and decode logic circuit 38 includes "N" number of detectors, corresponding to the number of bits in the trinary encoded signal. Each detector is coupled via one of the lines 41 to a corresponding three-position switch in switch matrix 40.

There are "N" number of three-position positions in the switch matrix 40, also corresponding to the number of bits in the trinary encoded signal. Each of these switches is individually set to indicate the duration of the pulse of the bit corresponding thereto. Such indications are provided by tri-state logic signals provided on the lines 41 from the switches in the matrix 40 to the corresponding detector in the input multiplexer and decode logic circuit 38. The signals on lines 41 are gated into the detectors in the circuit 38 in response to the pulsed clock signals provided on lines 37a from the frequency divider 36.

The detectors in the circuit 38 are scanned sequentially by scanning signals on lines 43 from the scan counter and decoder 42 to provide an N bit trinary encoded digital logic signal on lines 39 to the duty cycle generator 46. The signal on line 39 has a predetermined sequence of bit pulses of different predetermined durations. These predetermined durations are 25%, 50% and 75% of the total bit interval.

The scan counter and decoder 42 provides the scanning signals on the lines 43 to the input multiplexer and decode logic circuit 38 in response to the pulsed clock signals on lines 37b from the frequency divider 36. The scan counter and decoder 42 further responds to the pulsed clock signals on line 37b to provide a "blank enable" signal on line 49 to a blanking generator 44. The "blank enable" signal is provided on line 49 at the end of every other data scanning interval, a data scanning interval being equal to the combined duration of the N bits.

The blanking generator 44 responds to the "blank enable" signal on line 49 to provide a blanking signal on line 45 to the duty cycle generator 46. The interval of the blanking signal preferably is the same as one data scanning interval. The blanking signal is a continuous pulse that is terminated for a short duration just prior to the end of the blanking interval. This duration is equal to 25% of a bit interval.

Figure 4:
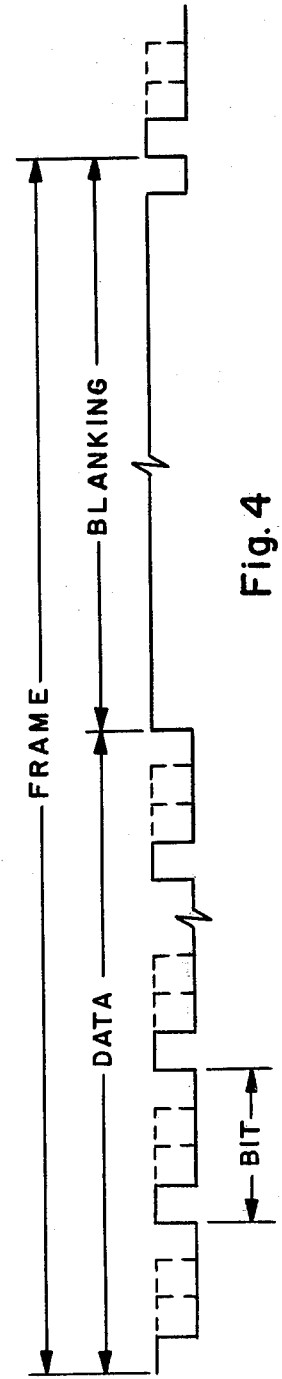
FIG. 4 shows a waveform of the trinary encoded signal provided by the encoder of FIG. 3.

The duty cycle generator 46 responds to the pulsed clock signals on lines 37c to provide an encoded signal on line 47 for transmission. The waveform of the encoded signal on line 47 is shown in FIG. 4. A data bit duration of 25% is shown by solid lines, whereas data bit durations of 50% and 75% are indicated by dashed lines. When a blanking signal is not provided on line 45 the duty cycle generator 46 provides a sequency of data bit pulses on line 47 in response to the trinary encoded digital logic signal on line 39; and when a blanking signal is provided on line 45, the duty cycle generator provides a continuous blanking pulse on line 47. The blanking pulse terminates at a time which is 25% of a bit time before the beginning of the first data bit pulse in the next data scanning interval. The encoded signal on line 47 has a frame time equal to the data scanning intervl of the N bits plus the blanking interval. The first "N−n" bits are address bits and the nth bits are command bits, which may be changed to control the output device to which the decoder 16 is connected via lines 25.

Figure 5:
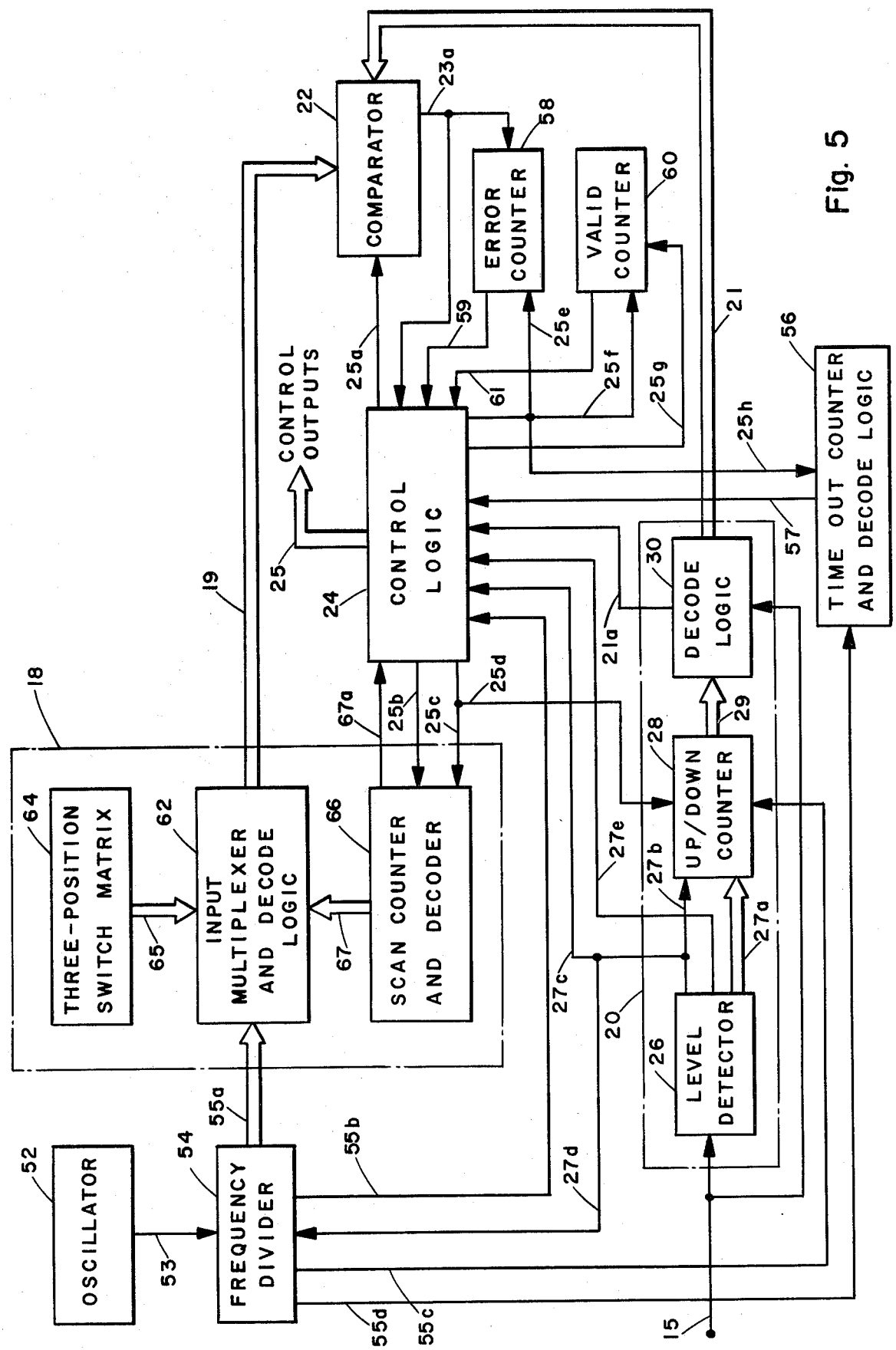
FIG. 5 is a schematic block diagram of a preferred embodiment of the decoder included in the system of the present invention.

Referring to FIG. 5 the decoder 16 includes a programmable signal generator 18, a code converter 20, a comparator 22, a control logic circuit 24, an oscillator 52, a frequency divider 54, and a time out counter and decode logic circuit 56. An error counter 58 and a valid counter 60 are included within the control logic circuit 24, but are shown separately to better explain their operation. The programmable signal generator 18 includes an input multiplexer and decode logic circuit 62, a three-position switch matrix 64, and a scan counter and decoder 66. The code converter 20 includes the level detector 26, the up/down counter 28 and the decode logic circuit 30.

The oscillator 52 is an R/C oscillator. The RC circuit of the oscillator 52 determines the frequency of a pulsed master clock signal which is provided on line 53. Except for the RC circuit, the oscillator 52 is contained within an integrated circuit. The RC circuit is external to the integrated circuit and the components thereof can readily be selected so as to select the frequency of the master clock signal on line 53.

The frequency divider 54 divides the master clock signal on line 53 to provide a plurality of different pulsed clock signals on lines 55a, 55b, 55c and 55d. The pulsed clocked signals on line 55a, 55b, 55c and 55d control the timing of various operations of the input multiplexer and decode logic circuit 62, the control logic circuit 24, the up/down counter 28, and the time-out counter and decode logic circuit 56, respectively.

The level detector 26 detects whether the level of the signal received on line 15 is high or low. The level detector 26 provides an indication on lines 27a to the up/down counter 28 for causing the counter 28 to count up when the detected level of the received signal on line 15 is high, and to count down when the detected level of the received signal on line 15 is low. The up/down counter 28 counts at a rate determined by a high frequency clock signal on line 55c from the frequency divider 54 such that there are approximately 100 total counts during each bit time.

Upon a positive going transistion in the received signal on line 15, the level detector 26 provides a signal to the up/down counter 28 on line 27b to preset the up/down counter 28 to a count of "16" and the signal on lines 27a causes the counter 28 to begin counting up. For a bit in the received signal on line 15 having a pulse duration T1 (equal to 25% of the bit time), the accumulated count in the counter 28 at the end of the bit time is approximately 16 plus 25 minus 75 equals −34. For a bit having a pulse duration T2, the accumulated count is approximately 16 plus 50 minus 50 equals +16, and for a bit having a pulse duration T3, the accumulated count is approximately 16 plus 75 minus 25 equals +66.

The accumulated count in the counter 28 is provided on lines 29 to the decode logic circuit 30. Upon each positive going transition in the received signal on line 15 the decode logic circuit 30 provides a digital logic signal word on lines 21 to the comparator 22 corresponding to one or another of the predetermined durations T1, T2, or T3 in accordance with the accumulated count from the counter 28. If the accumulated count is less than zero, a two-bit digital word corresponding to the duration T1 is provided on lines 21. If the accumulated count is in a range from 0 to 31, a two-bit digital word corresponding to the duration T2 is provided on lines 21. If the accumulated count is greater than 31, a two-bit digital word corresponding to the duration T3 is provided on lines 21.

When the level detector 26 detects a positive going transition in the received signal on line 15 a signal pulse is delivered on line 27c to the control logic circuit 24 and on line 27d to the frequency divider 54 in order to synchronize the production of the programmed digital logic signal on lines 19 with the decoded digital logic signal on lines 21. The pulsed clock signal provided on lines 55a by the frequency divider 54 to the input multiplexer and decode logic circuit 62 is synchronized in response to the signal pulse provided on line 27d. The frequency divider 54 also responds to the signal pulse on line 27d by synchronizing a "detect" clock signal pulse which is provided on line 55b to the control logic circuit 24. The control logic circuit 24 responds to the "detect" clock signal pulse on line 55b by delivering a "compare enable" signal pulse on line 25a to the comparator 22 and a shift clock pulse on line 25b to the scan counter and decoder 66. The clocking of the scan counter and decoder 66 is thereby synchronized with the provision of the pulsed clock signals on lines 55a and the comparison step performed by the comparator 22. Upon each down-going transition in the received signal on line 15, the level detector 26 delivers a signal pulse on line 27e to the control logic circuit 24 which is used to indicate the first data bit after the blanking period.

The input multiplexer and decode logic circuit 62 includes "N−n" number of detectors, corresponding to the number of address bits in the trinary encoded signal minus the data bits in the trinary encoded signal. N−n of these detectors are respectively coupled via the lines 65 to a corresponding number of three-position switches in the three-position switch matrix 64.

There are "N−n" number of three-position positions in the switch matrix 64 corresponding to the number of address bits in the trinary encoded signal provided on line 47 by the encoder 10 (See FIG. 3). Each of these switches is individually set to indicate the same pulse bit duration as the switch in the corresponding sequential bit position in the switch matrix 40 of the encoder 10. In the decoder 16 these indications are provided by tri-state logic signals provided on the lines 65 from the switches in the matrix 64 to the corresponding detector in the input multiplexer and decode logic circuit 62. The signals on lines 65 are gated into the detectors in the circuit 62 in response to the pulsed clock signals provided on lines 55a from the frequency divider 54. The timing of the scanning of the input multiplexer and decode logic circuit 62 is such that when the programmed digital logic signal on lines 19 is synchronized with the decoded digital logic signal on lines 21, the command bit in the Nth data bit position of the received signal on line 15 is scanned from the Nth detector of the circuit 62.

The detectors in the circuit 62 are scanned sequentially by scanning signals provided on lines 67 from the scan counter and decoder 66 to provide an N word trinary encoded digital logic signal on lines 19 to the comparator 22. Each word is a two-bit digital word. The signal on lines 19 has a predetermined sequence of different digital words corresponding to a predetermined sequence of bit pulses of different predetermined durations in the encoded signal on line 47 of the encoder 10.

The scan counter and decoder 66 provides the scanning signals on the lines 67 to the input multiplexer and decode logic circuit 62 in response to the shift clock signals on line 25b from the control logic circuit 24. When the scan counter and decoder 66 has completed a scan of all N−n detectors of the input multiplexer and decode logic circuit 66, and n data bits, a "complete scan" signal is provided on line 67a to the control logic circuit 24 and a blanking pulse corresponding to the blanking pulse shown in FIG. 4 is delivered on lines 19 to the comparator 22. The scan counter and decoder 66 does not scan the input multiplexer and decode logic circuit again until it is reset in response to a "reset" signal on line 25c from the control logic circuit 24.

During the blanking interval of the encoded signal received on line 15, the up/down counter 28 continues to count up. When a count of 400 (corresponding to approximately four bit times) is accumulated in the counter 28, the decode logic circuit 30 delivers a signal on line 21a to the control logic circuit 24, thereby indicating to the control logic circuit 24 that the received signal on line 15 is in a blanking interval. Upon the positive going transition in the received signal on line 15 at the conclusion of the blanking interval, the control circuit 24 provides the reset signal on line 25c in response to the signal pulse produced on line 27c. A signal pulse is produced on line 27c upon each positive going transition of the signal on line 15. However, the reset pulse on line 25c is provided only in response to a signal pulse occurring on line 27c at the conclusion of a blanking interval. At the same time a reset signal is also provided on line 25d to reset the up/down counter 28.

The comparator 22 compares the decoded digital logic signal on lines 21 with the programmed digital logic signal on lines 19 in response to each "compare enable" pulse received on line 25a from the control logic circuit 24. The timing of the detection of the bit in the Nth bit position of the received encoded data signal on line 15 is such that the bit represented by the digital word in the Nth bit position in the frame of the programmed digital logic signal on lines 19 that is being compared by the comparator 22 is the same as the bit represented by the digital word in the Nth bit position in the frame of the decoded digital logic signal on lines 21.

The comparator 22 provides an error indication on line 23a to clock the error counter 58 once during each frame in which the comparison reveals a disagreement between the programmed digital logic signal on lines 19 and the decoded digital logic signal on lines 21. The state of the signal on line 23a also is discerned by the control logic circuit 24. When an error indication does not occur on line 23a during a frame, thereby indicating an agreement between the programmed digital logic signal on lines 19 and the decoded digital logic signal on lines 21 during that frame, the control logic circuit 24 provides a valid pulse on line 25f to clock the valid counter 60, and on line 25e to clear and reset the error counter 58. Thus the error counter 58 counts the number of successive frames in which an error occurs (error frames), while the valid counter 60 counts the number of frames in which an error does not occur (valid frames). Whenever the error counter 58 counts three successive error frames a signal pulse is delivered on line 59 to the control logic circuit 24, which in turn delivers a signal on line 25g to clear and reset the valid counter 60.

When the count in the valid counter 60 reaches "four" an enable signal to such effect is provided on line 61 to cause the control logic circuit 24 to enable the control outputs 25.

When the encoded signal transmitted by the transmitter 12 is not received on line 15 the comparator 22 will continuously provide error indications on line 23a since the programmed digital logic signal on lines 19 will not agree with whatever decoded digital logic signal is provided on line 21. If such condition presists for a predetermined duration, it becomes necessary to disable the control outputs 25. This is accomplished by the control logic circuit 24 in response to a disable signal delivered on line 57 from the time-out counter and decode logic circuit 56.

The time-out counter and control logic circuit 56 is clocked by a "time-out" clock signal on line 55d from the frequency divider 54 and is cleared and reset by a valid pulse on line 25h from the control logic circuit 24 each time the control logic circuit 24 delivers a valid pulse on line 25f to the valid counter. If the time-out counter and decode logic circuit 56 is not reset during an interval corresponding to the predetermined duration it will continue to count until it reaches a predetermined count corresponding to the predetermined duration, whereupon it delivers the disable signal on line 57 to the control logic circuit 24 for causing the control logic circuit 24 to disable the control outputs 25. When the control logic circuit 24 next receives an indication on line 23a that a valid frame has been compared by the comparator 22, a valid pulse is delivered on line 25h to clear and reset the time-out counter and decode logic circuit 56 and the disable signal is removed from line 57 to the control logic circuit 24.

We claim:

1. A system for recognizing a received encoded signal as being from a particular transmitter, comprising
   an encoder for encoding a signal to have a predetermined sequence of pulses of different predetermined durations within a constant bit interval in accordance with a selected code; wherein each of the different predetermined durations corresponds to a different bit;
   a transmitter for transmitting the encoded signal;
   a receiver for receiving the transmitted encoded signal; and
   a decoder for recognizing the received encoded signal as being from the transmitter, comprising
      a programmable digital logic signal generator that is programmed in accordance with the selected code for generating a programmed digital logic signal having a predetermined sequence of different digital words corresponding to the predetermined sequence of pulses of different predetermined durations in the transmitted encoded signal;
      a code converter for converting the received encoded signal to a decoded digital logic signal in accordance with the selected code;
      a comparator for comparing the decoded digital logic signal with the programmed digital logic signal; and a control logic circuit coupled to the programmable signal generator, the code converter and the comparator for synchronizing the programmed digital logic signal with the decoded digital logic signal and for recognizing the received encoded signal as being from the transmitter when said comparison indicates a predetermined number and sequence of valid comparisons between the decoded digital logic signal and the programmed digital logic signal;

characterized by the code converter comprising means for measuring and comparing the relative durations of the pulse and the non-pulse time during each bit interval, and for providing a decoded digital logic signal having digital words corresponding to one or another of the predetermined durations in accordance with said comparison of the relative durations.

2. A system according to claim 1, wherein the code converter comprises a level detector for detecting whether the received encoded signal has a high level or a low level;

a counter for counting at a much higher rate than the pulse rate of the received encoded signal and connected to the level detector for counting up when the received encoded signal is high and for counting down when the received encoded signal is low; and a decode logic circuit coupled to the receiver and the counter for providing a decoded digital logic signal having words corresponding to one or another of the predetermined durations in accordance with the accumulated count in the counter upon a predetermined transition in the level of the received encoded signal.

3. A system according to claim 1, wherein the encoder and the decoder each include an oscillator for providing master clock signals for controlling the timing of their respective operations, and each oscillator includes an untuned RC circuit for determining the frequency of its master clock signal.

4. A system according to claim 1, wherein the control logic circuit includes an error counter coupled to the comparator for counting successive error frames in which the decoded digital logic signal disagrees with the programmed digital logic signal; and the control logic circuit is coupled to the comparator for providing a valid pulse for each valid frame in which the decoded digital logic signal agrees with the programmed digital logic signal; and further includes a valid counter for counting valid pulses and for providing an enable signal when a predetermined number of valid pulses corresponding to a predetermined number of valid frames is counted;

wherein the control logic circuit is adapted for also providing said valid pulse to the error counter for clearing and resetting the error counter whenever there is a valid frame; for enabling a control output of the decoder in response to said enable signal from the valid counter whenever the valid counter counts said predetermined number of valid pulses; and for clearing and resetting the valid counter whenever the error counter counts a predetermined number of successive error frames; and the system further comprises a time-out counter for counting at a given rate and for providing a disable signal when a predetermined count corresponding to a given duration is reached; wherein the time-out counter is coupled to the contol logic circuit for being reset each time the control logic circuit provides a valid pulse; and the control logic circuit is further adapted for responding to said disable signal from the time-out counter by disabling the control output of the decoder.

5. A decoder according to claim 4, wherein the encoder and the decoder each include an oscillator for providing master clock signals for controlling the timing of their respective operations, and each oscillator includes an untuned RC circuit for determining the frequency of its master clock signal.

6. A decoder for recognizing a received encoded signal as being from a particular transmitter, wherein the transmitted encoded signal has a predetermined sequence of pulses of different predetermined durations within a constant bit interval in accordance with a selected code, and each of the different predetermined durations corresponds to a different bit, comprising a programmable digital logic signal generator that is programmed in accordance with the selected code for generating a programmed digital logic signal having a predetermined sequence of different digital words corresponding to the predetermined sequence of pulses of different predetermined durations in the transmitted encoded signal;

a code converter for converting the received encoded signal to a decoded digital logic signal in accordance with the selected code;

a comparator for comparing the decoded digital logic signal with the programmed digital logic signal; and a control logic circuit coupled to the programmable signal generator, the code converter, and the comparator for synchronizing the programmed digital logic signal with the decoded digital logic signal and for recognizing the received encoded signal as being from the transmitter when said comparison indicates a predetermined number and sequence of valid comparisons between the decoded digital logic signal and the programmed digital logic signal;

characterized by the code converter comprising means for measuring and comparing the relative durations of the pulse and non-pulse time during each bit interval, and for providing a decoded digital logic signal having digital words corresponding to one or another of the predetermined durations in accordance with said comparison of the relative durations.

7. A decoder according to claim 6, wherein the code converter comprises a level detector for detecting whether the received encoded signal has a high level or a low level;

a counter for counting at a much higher rate than the pulse rate of the received encoded signal and connected to the level detector for counting up when the received encoded signal is high and for counting down when the received encoded signal is low; and a decode logic circuit coupled to the receiver and the counter for providing a decoded digital logic signal having words corresponding to one or another of the predetermined durations in accordance with the accumulated count in the counter upon a predetermined transition in the level of the received encoded signal.

8. A system according to claim 6, wherein the control logic circuit includes an error counter coupled to the comparator for counting successive error frames in which the decoded logic signal disagrees with the programmed digital logic signal; and the control logic circuit is coupled to the comparator for providing a valid pulse for each valid frame in which the decoded digital logic signal agrees with the programmed digital logic signal; and further includes a valid counter for counting valid pulses and for providing an enable signal when a predetermined number of valid pulses corresponding to a predetermined number of valid frames is counted;

wherein the control logic circuit is adapted for also providing said valid pulse to the error counter for clearing and resetting the error counter whenever there is a valid frame; for enabling a control output of the decoder in response to said enable signal from the valid counter whenever the valid counter counts said predetermined number of valid pulses; and for clearing and resetting the valid counter whenever the error counter counts a predetermined number of successive error frames; and the sytem further comprises a time-out counter for counting at a given rate and for providing a disable signal when a predetermined count corresponding to a given duration is reached; wherein the time-out counter is coupled to the control logic circuit for being reset each time the control logic circuit provides a valid pulse; and the control logic circuit is further adapted for responding to said disable signal from the time-out counter by disabling the control output of the decoder.

9. A decoder for recognizing a received encoded signal as being from a particular transmitter, wherein the transmitted encoded signal has a predetermined sequence of pulses of three different predetermined durations within a constant bit interval in accordance with a trinary code, and each of the different predetermined durations corresponds to a different bit; comprising a programmable digital logic signal generator that is programmed in accordance with the trinary code for generating a programmed digital logic signal having a predetermined sequence of different digital words corresponding to the predetermined sequence of pulses of different predetermined durations in the transmitted encoded signal;

a code converter for converting the received encoded signal to a decoded digital logic signal in accordance with the trinary code;

a comparator for comparing the decoded digital logic signal with the programmed digital logic signal; and a control logic circuit coupled to the programmable signal generator, the code converter and the comparator for synchronizing the programmed digital logic signal with the decoded digital logic signal and for recognizing the received encoded signal as being from the transmitter when said comparison indicates a predetermined number and sequence of valid comparison between the decoded digital logic signal and the programmed digital logic signal.

10. A system according to claim 9, wherein the control logic circuit includes an error counter coupled to the comparator for counting successive error frames in which the decoded digital logic signal disagrees with the programmed digital logic signal; and the control logic circuit is coupled to the comparator for providing a valid pulse for each valid frame in which the decoded digital logic signal agrees with the programmed digital logic signal; and further includes a valid counter for counting valid pulses and for providing an enable signal when a predetermined number of valid pulses corresponding to a predetermined number of valid frames is counted;

wherein the control logic circuit is adapted for also providing said valid pulse to the error counter for clearing and resetting the error counter whenever there is a valid frame; for enabling a control output of the decoder in response to said enable signal from the valid counter whenever the valid counter counts said predetermined number of valid pulses; and for clearing and resetting the valid counter whenever the error counter counts a predetermined number of successive error frames; and the system further comprises a time-out counter for counting at a given rate and for providing a disable signal when a predetermined count corresponding to a given duration is reached; wherein the time-out counter is coupled to the control logic circuit for being reset each time the control logic circuit provides a valid pulse; and the control logic circuit is further adapted for responding to said disable signal from the time-out counter by disabling the control output of the decoder.

11. A decoder according to claim 9, wherein the code converter comprises means for measuring and comparing the relative durations of the pulse and the non-pulse time during each bit interval, and for providing a decoded digital logic signal having digital words corresponding to one or another of the predetermined durations in accordance with said comparison of the relative durations.

12. A decoder according to claim 11, wherein the code converter comprises a level detector for detecting whether the received encoded signal has a high level or a low level;

a counter for counting at a much higher rate than the pulse rate of the received encoded signal and connected to the level detector for counting up when the received encoded signal is high and for counting down when the received encoded signal is low; and a decode logic circuit coupled to the receiver and the counter for providing a decoded digital logic signal having words corresponding to one or another of the predetermined durations in accordance with the accumulated count in the counter upon a predetermined transition in the level of the received encoded signal.

13. A decoder according to claim 11, wherein the encoder and the decoder each include an oscillator for providing master clock signals for controlling the timing of their respective operations, and each oscillator includes an untuned RC circuit for determining the frequency of its master clock signal.

14. A system for recognizing a received encoded signal as being from a particular transmitter, comprising
an encoder for encoding a signal to have a predetermined sequence of pulses of three different predetermined durations within a constant bit interval in accordance with a trinary code; wherein each of the different predetermined durations corresponds to a different bit;
a transmitter for transmitting the encoded signal;
a receiver for receiving the transmitted encoded signal; and
a decoder for recognizing the received encoded signal as being from the transmitter, comprising
a programmable digital logic signal generator that is programmed in accordance with the trinary code for generating a programmed digital logic signal having a predetermined sequence of different digital words corresponding to the predetermined sequence of pulses of different predetermined durations in the transmitted encoded signal;
a code converter for converting the received encoded signal to a decoded digital logic signal in accordance with the trinary code;
a comparator for comparing the decoded digital logic signal with the programmed digital logic signal; and
a control logic circuit coupled to the programmable signal generator, the code converter and the comparator for synchronizing the programmed digital logic signal with the decoded digital logic signal and for recognizing the received encoded signal as being from the transmitter when said comparison indicates a predetermined number and sequence of valid comparisons between the decoded digital logic signal and the programmed digital logic signal.

15. A system according to claim 14, wherein the control logic circuit includes
an error counter coupled to the comparator for counting successive error frames in which the decoded digital logic signal disagrees with the programmed digital logic signal; and
the control logic circuit is coupled to the comparator for providing a valid pulse for each valid frame in which the decoded digital logic signal agrees with the programmed digital logic signal; and further includes
a valid counter for counting valid pulses and for providing an enable signal when a predetermined number of valid pulses corresponding to a predetermined number of valid frames is counted;
wherein the control logic circuit is adapted for also providing said valid pulse to the error counter for clearing and resetting the error counter whenever there is a valid frame; for enabling a control output of the decoder in response to said enable signal from the valid counter whenever the valid counter counts said predetermined number of valid pulses; and for clearing and resetting the valid counter whenever the error counter counts a predetermined number of successive error frames; and
the system further comprises
a time-out counter for counting at a given rate and for providing a disable signal when a predetermined count corresponding to a given duration is reached; wherein the time-out counter is coupled to the control logic circuit for being reset each time the control logic circuit provides a valid pulse; and
the control logic circuit is further adapted for responding to said disable signal from the time-out counter by disabling the control output of the decoder.

16. A system according to claim 14, wherein the code converter comprises means for measuring and comparing the relative durations of the pulse and the non-pulse time during each bit interval, and for providing a decoded digital logic signal having digital words corresponding to one or another of the predetermined durations in accordance with said comparison of the relative durations.

17. A system according to claim 16, wherein the code converter comprises
a level detector for detecting whether the received encoded signal has a high level or a low level;
a counter for counting at a much higher rate than the pulse rate of the received encoded signal and connected to the level detector for counting up when the received encoded signal is high and for counting down when the received encoded signal is low; and
a decode logic circuit coupled to the receiver and the counter for providing a decoded digital logic signal having words corresponding to one or another of the predetermined durations in accordance with the accumulated count in the counter upon a predetermined transition in the level of the received encoded signal.

18. A system according to claim 16, wherein the encoder and the decoder each include an oscillator for providing master clock signals for controlling the timing of their respective operations, and each oscillator includes an untuned RC circuit for determining the frequency of its master clock signal.

* * * * *